(12) United States Patent
Bartel et al.

(10) Patent No.: US 8,599,528 B2
(45) Date of Patent: Dec. 3, 2013

(54) DC AND RF PASS BROADBAND SURGE SUPPRESSOR

(75) Inventors: Karl C. Bartel, Gardnerville, NV (US); Chris Penwell, Minden, NV (US)

(73) Assignee: Transtector Systems, Inc., Hayden, ID (US)

( * ) Notice: Subject to any disclaimer, the term of this patent is extended or adjusted under 35 U.S.C. 154(b) by 742 days.

(21) Appl. No.: 12/263,170

(22) Filed: Oct. 31, 2008

(65) Prior Publication Data

US 2009/0284888 A1 Nov. 19, 2009

Related U.S. Application Data

(60) Provisional application No. 61/054,410, filed on May 19, 2008.

(51) Int. Cl.
*H02H 1/04* (2006.01)
(52) U.S. Cl.
USPC .......................................... 361/119; 361/118
(58) Field of Classification Search
USPC .................................. 361/118, 119
See application file for complete search history.

(56) References Cited

U.S. PATENT DOCUMENTS

| | | |
|---|---|---|
| 2,030,179 A | 2/1936 | Potter |
| 3,167,729 A | 1/1965 | Hall |
| 3,323,083 A | 5/1967 | Ziegler |
| 3,619,721 A | 11/1971 | Westendorp |
| 3,663,901 A | 5/1972 | Forney, Jr. |
| 3,731,234 A | 5/1973 | Collins |
| 3,750,053 A | 7/1973 | LeDonne |
| 3,783,178 A | 1/1974 | Philibert |
| 3,831,110 A | 8/1974 | Eastman |
| 3,845,358 A | 10/1974 | Anderson et al. |
| 3,944,937 A | 3/1976 | Fujisawa et al. |
| 3,980,976 A | 9/1976 | Tadama et al. |
| 4,046,451 A | 9/1977 | Juds et al. |
| 4,047,120 A | 9/1977 | Lord et al. |
| 4,112,395 A | 9/1978 | Seward |
| 4,262,317 A | 4/1981 | Baumbach |
| 4,356,360 A | 10/1982 | Volz |
| 4,359,764 A | 11/1982 | Block |
| 4,384,331 A | 5/1983 | Fukuhara et al. |
| 4,409,637 A | 10/1983 | Block |
| 4,481,641 A | 11/1984 | Gable et al. |

(Continued)

FOREIGN PATENT DOCUMENTS

| | | |
|---|---|---|
| CH | 675933 A5 | 11/1990 |
| JP | 08-066037 | 3/1996 |

(Continued)

OTHER PUBLICATIONS

PCT/US03/17050 ISR, May 30, 2003.

*Primary Examiner* — Jared Fureman
*Assistant Examiner* — Tien Mai
(74) *Attorney, Agent, or Firm* — Snell & Wilmer, LLP

(57) ABSTRACT

A surge protection circuit to reduce capacitance inherent of standard diode packaging and to improve voltage clamping reaction speeds under high surge conditions. The surge protection circuit has a coil having a first end and a second end and a diode cell having a top layer, a center diode junction, and a bottom layer. The top layer is directly connected to the second end of the coil and the bottom layer is directly connected to a ground. The diode cell has no wire leads.

20 Claims, 8 Drawing Sheets

(56) References Cited

U.S. PATENT DOCUMENTS

| | | |
|---|---|---|
| 4,554,608 A | 11/1985 | Block |
| 4,563,720 A | 1/1986 | Clark |
| 4,586,104 A | 4/1986 | Standler |
| 4,689,713 A | 8/1987 | Hourtane et al. |
| 4,698,721 A | 10/1987 | Warren |
| 4,727,350 A | 2/1988 | Ohkubo |
| 4,952,173 A * | 8/1990 | Peronnet et al. ............ 439/583 |
| 4,984,146 A | 1/1991 | Black et al. |
| 4,985,800 A | 1/1991 | Feldman et al. |
| 5,053,910 A | 10/1991 | Goldstein |
| 5,057,964 A | 10/1991 | Bender et al. |
| 5,102,818 A | 4/1992 | Paschke et al. |
| 5,122,921 A | 6/1992 | Koss |
| 5,124,873 A | 6/1992 | Wheeler et al. |
| 5,142,429 A | 8/1992 | Jaki |
| 5,166,855 A | 11/1992 | Turner |
| 5,170,151 A | 12/1992 | Hochstein |
| 5,278,720 A | 1/1994 | Bird |
| 5,321,573 A | 6/1994 | Person et al. |
| 5,353,189 A | 10/1994 | Tomlinson |
| 5,412,526 A | 5/1995 | Kapp et al. |
| 5,442,330 A | 8/1995 | Fuller et al. |
| 5,537,044 A | 7/1996 | Stahl |
| 5,611,224 A | 3/1997 | Weinerman et al. |
| 5,617,284 A | 4/1997 | Paradise |
| 5,625,521 A | 4/1997 | Luu |
| 5,667,298 A | 9/1997 | Musil et al. |
| 5,721,662 A | 2/1998 | Glaser et al. |
| 5,781,844 A | 7/1998 | Spriester et al. |
| 5,790,361 A | 8/1998 | Minich |
| 5,798,790 A | 8/1998 | Knox et al. |
| 5,844,766 A | 12/1998 | Miglioli et al. |
| 5,854,730 A | 12/1998 | Mitchell et al. |
| 5,953,195 A | 9/1999 | Pagliuca |
| 5,966,283 A | 10/1999 | Glaser et al. |
| 5,982,602 A | 11/1999 | Tellas et al. |
| 5,986,869 A | 11/1999 | Akdag |
| 6,054,905 A | 4/2000 | Gresko |
| 6,060,182 A | 5/2000 | Tanaka et al. |
| 6,061,223 A | 5/2000 | Jones et al. |
| 6,086,544 A * | 7/2000 | Hibner et al. ............... 600/568 |
| 6,115,227 A | 9/2000 | Jones et al. |
| 6,137,352 A | 10/2000 | Germann |
| 6,141,194 A | 10/2000 | Maier |
| 6,177,849 B1 | 1/2001 | Barsellotti et al. |
| 6,226,166 B1 | 5/2001 | Gumley et al. |
| 6,236,551 B1 | 5/2001 | Jones et al. |
| 6,243,247 B1 | 6/2001 | Akdag et al. |
| 6,252,755 B1 | 6/2001 | Willer |
| 6,281,690 B1 | 8/2001 | Frey |
| 6,292,344 B1 | 9/2001 | Glaser et al. |
| 6,342,998 B1 | 1/2002 | Bencivenga et al. |
| 6,381,283 B1 | 4/2002 | Bhardwaj et al. |
| 6,385,030 B1 | 5/2002 | Beene |
| 6,394,122 B1 | 5/2002 | Sibley et al. |
| 6,421,220 B2 | 7/2002 | Kobsa |
| 6,502,599 B1 | 1/2003 | Sibley et al. |
| 6,527,004 B1 | 3/2003 | Sibley et al. |
| 6,535,369 B1 | 3/2003 | Redding et al. |
| 6,650,203 B2 | 11/2003 | Gerstenberg et al. |
| 6,721,155 B2 | 4/2004 | Ryman |
| 6,754,060 B2 | 6/2004 | Kauffman |
| 6,757,152 B2 | 6/2004 | Galvagni et al. |
| 6,782,329 B2 | 8/2004 | Scott |
| 6,785,110 B2 | 8/2004 | Bartel et al. |
| 6,789,560 B1 | 9/2004 | Sibley et al. |
| 6,814,100 B1 | 11/2004 | Sibley et al. |
| 6,816,348 B2 | 11/2004 | Chen et al. |
| 6,968,852 B1 | 11/2005 | Sibley |
| 6,975,496 B2 | 12/2005 | Jones et al. |
| 7,082,022 B2 | 7/2006 | Bishop |
| 7,092,230 B2 | 8/2006 | Inauen |
| 7,104,282 B2 | 9/2006 | Hooker et al. |
| 7,106,572 B1 | 9/2006 | Girard |
| 7,130,103 B2 | 10/2006 | Murata |
| 7,159,236 B2 * | 1/2007 | Abe et al. ..................... 725/111 |
| 7,221,550 B2 | 5/2007 | Chang et al. |
| 7,250,829 B2 | 7/2007 | Namura |
| 7,338,547 B2 | 3/2008 | Johnson et al. |
| 7,371,970 B2 | 5/2008 | Flammer et al. |
| 7,453,268 B2 | 11/2008 | Lin |
| 7,471,172 B2 | 12/2008 | Holst et al. |
| 7,507,105 B1 | 3/2009 | Peters et al. |
| 7,623,332 B2 * | 11/2009 | Frank et al. .................. 361/119 |
| 7,808,752 B2 * | 10/2010 | Richiuso et al. ............. 361/56 |
| 7,817,398 B1 | 10/2010 | Maples |
| 2002/0167302 A1 | 11/2002 | Gallavan |
| 2002/0191360 A1 | 12/2002 | Colombo et al. |
| 2003/0072121 A1 | 4/2003 | Bartel et al. |
| 2003/0211782 A1 | 11/2003 | Esparaz et al. |
| 2004/0042149 A1 | 3/2004 | Devine et al. |
| 2004/0121648 A1 | 6/2004 | Voros |
| 2004/0145849 A1 | 7/2004 | Chang et al. |
| 2004/0264087 A1 | 12/2004 | Bishop |
| 2005/0036262 A1 | 2/2005 | Siebenthall et al. |
| 2005/0044858 A1 | 3/2005 | Hooker et al. |
| 2005/0176275 A1 | 8/2005 | Hoopes et al. |
| 2005/0185354 A1 | 8/2005 | Hoopes |
| 2006/0120005 A1 | 6/2006 | Van Sickle |
| 2006/0139832 A1 | 6/2006 | Yates et al. |
| 2006/0146458 A1 | 7/2006 | Mueller |
| 2007/0053130 A1 | 3/2007 | Harwath |
| 2007/0095400 A1 | 5/2007 | Bergquist et al. |
| 2007/0097583 A1 | 5/2007 | Harwath |
| 2007/0139850 A1 | 6/2007 | Kamel et al. |
| 2009/0103226 A1 | 4/2009 | Penwell et al. |
| 2009/0109584 A1 | 4/2009 | Jones et al. |
| 2009/0296430 A1 | 12/2009 | Rieux-Lopez et al. |
| 2011/0141646 A1 | 6/2011 | Jones et al. |

FOREIGN PATENT DOCUMENTS

| | | |
|---|---|---|
| JP | 11-037400 | 2/1999 |
| JP | 2003-070156 | 3/2003 |
| JP | 2003-111270 | 4/2003 |
| KR | 10-2003-0081041 | 10/2003 |
| KR | 1020090018497 | 2/2009 |
| WO | WO 9510116 | 4/1995 |
| WO | WO 2011-119723 | 12/2011 |

* cited by examiner

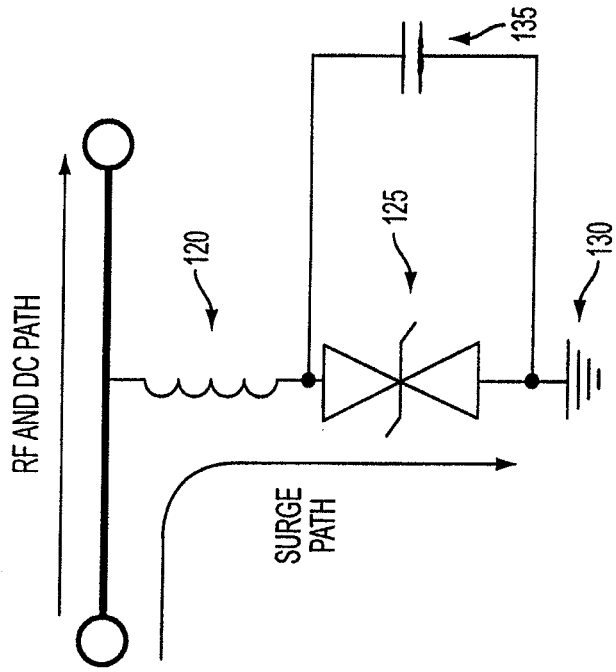
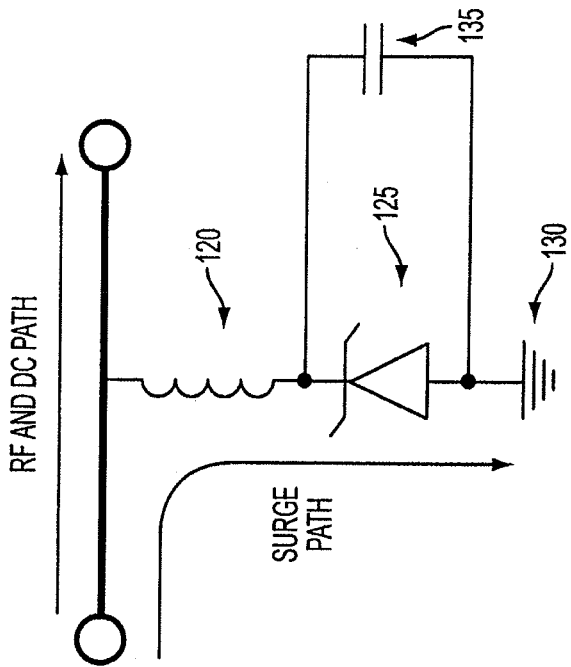

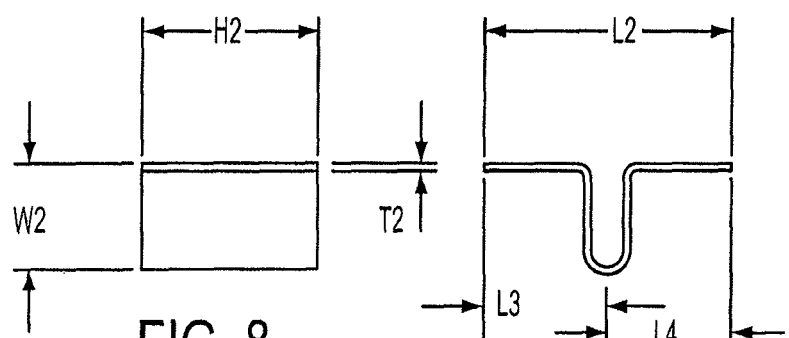
FIG. 8
FIG. 9
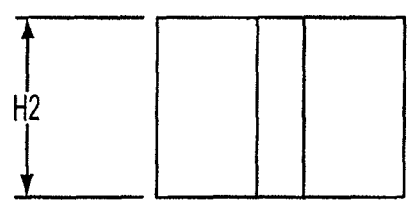
FIG. 10

DC AND RF PASS BROADBAND SURGE SUPPRESSOR

CROSS-REFERENCE TO RELATED APPLICATIONS

The present application for patent claims priority from and the benefit of provisional application Ser. No. 61/054,410 entitled "DC PASS BROADBAND RF PROTECTOR," filed on May 19, 2008, which is expressly incorporated herein by reference.

BACKGROUND

1. Field

The invention relates to surge protection. More particularly, the invention relates to a surge protection device for passing DC and RF signals.

2. Related Art

Surge protection devices protect electronic equipment from being damaged by large variations in the current and voltage across power and transmission lines resulting from lightning strikes, switching surges, transients, noise, incorrect connections, and other abnormal conditions or malfunctions. Large variations in the power and transmission line currents and voltages can change the operating frequency range of the electronic equipment and can severely damage and/or destroy the electronic equipment. For example, lightning is a complex electromagnetic energy source having potentials estimated from 5 million to 20 million volts and currents reaching thousands of amperes that can severely damage and/or destroy the electronic equipment.

Surge protection devices typically found in the art and used in protecting electronic equipment include capacitors, diodes, gas tubes, inductors, and metal oxide varistors. A capacitor blocks the flow of direct current (DC) and permits the flow of alternating current (AC) depending on the capacitor's capacitance and the current frequency. At certain frequencies, the capacitor might attenuate the AC signal. For example, the larger the capacitance value, the greater the attenuation. Typically, the capacitor is placed in-line with the power or transmission line to block the dc signal and undesirable surge transients.

Gas tubes contain hermetically sealed electrodes, which ionize gas during use. When the gas is ionized, the gas tube becomes conductive and the breakdown voltage is lowered. The breakdown voltage varies and is dependent upon the rise time of the surge. Therefore, depending on the surge, several microseconds may elapse before the gas tube becomes ionized, thus resulting in the leading portion of the surge passing to the capacitor. Gas tubes are attached at one end to the power or transmission line and at another end to the ground plane, diverting the surge current to ground.

Inductors can be attached to the power or transmission line after the gas tube and before the capacitor to divert the leading portion of the surge to ground. An inductor is a device having one or more windings of a conductive material, around a core of air or a ferromagnetic material, for introducing inductance into an electric circuit. An inductor opposes changes in current, whereas a capacitor opposes changes in voltage.

One drawback of conventional surge protection devices is the difficulty in impedance matching the surge protection device with the system. Another drawback of conventional surge protection devices is the elevated voltage at which they become conductive and the higher throughput energy levels. Still yet another drawback of conventional surge protection devices is poor bandwidth capabilities and poor RF performance at high power levels.

SUMMARY

A surge protection circuit to reduce capacitance inherent of standard diode packaging and to improve voltage clamping reaction speeds under high surge conditions. The surge protection circuit has a coil having a first end and a second end and a diode cell having a top layer, a center diode junction, and a bottom layer. The top layer is directly connected to the second end of the coil and the bottom layer is directly connected to a ground. The diode cell has no wire leads.

A surge protection device comprising a housing, a cavity defined by the housing, first and second connector pins positioned within the cavity, and a loop foil positioned within the cavity, the loop foil having a first end connected to the first connector pin and a second end connected to the second connector pin. The surge protection device may also include a coil positioned within the cavity, the coil having a first end connected to the first connector pin and a second end, and a diode cell connected to the housing, the diode cell having a top layer, a center diode junction, and a bottom layer, the top layer directly connected to the second end of the coil and the bottom layer directly connected to the housing.

A surge protection device having a housing, a cavity defined by the housing, a diode positioned within the cavity, and first and second connector pins positioned within the cavity. The surge protection device may also include a loop foil positioned within the cavity, the loop foil having a first plate connected to the first connector pin, a second plate connected to the second connector pin, and a third curved plate connecting the first plate to the second plate, and an inductor positioned within the cavity, the inductor having a first end connected to the first connector pin and a second end connected to the diode.

BRIEF DESCRIPTION OF THE DRAWINGS

The features, objects, and advantages of the invention will become more apparent from the detailed description set forth below when taken in conjunction with the drawings, wherein:

FIGS. 2A-2D are schematic diagrams showing different diode and capacitor configurations that can be implemented with the surge protection circuit of FIG. 1 according to various embodiments of the invention;

FIG. 8 is a side view of a loop foil according to an embodiment of the invention;

FIG. 9 is a top view of a loop foil according to an embodiment of the invention;

FIG. 10 is a front view of a loop foil according to an embodiment of the invention;

DETAILED DESCRIPTION

Apparatus, systems and methods that implement the embodiments of the various features of the invention will now be described with reference to the drawings. The drawings and the associated descriptions are provided to illustrate some embodiments of the invention and not to limit the scope of the invention. Throughout the drawings, reference numbers are re-used to indicate correspondence between referenced elements. In addition, the first digit of each reference number indicates the figure in which the element first appears.

Figure 1:
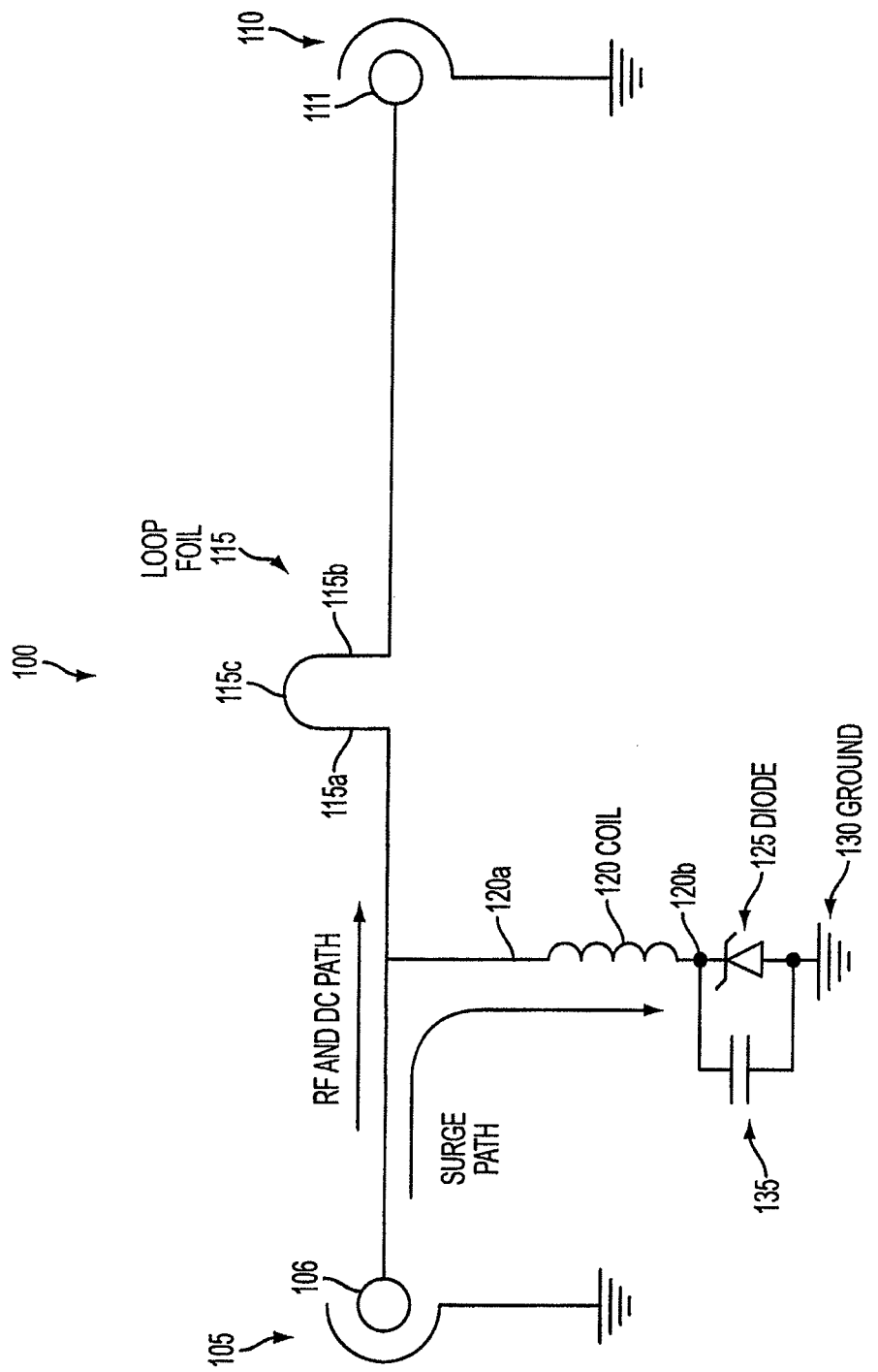
FIG. 1 is a schematic diagram of a surge protection circuit according to an embodiment of the invention.

FIG. 1 is a schematic diagram of a surge protection circuit 100 according to an embodiment of the invention. The surge protection circuit 100 may include a first port 105, a second port 110, a loop foil 115, a coil 120, a diode 125, and a ground 130. Optionally, the surge protection circuit 100 may include a capacitor 135. The surge protection circuit 100 provides improved RF coupling between the first port 105 and the second port 110, improved voltage clamping using the coil 120 and the diode 125, improved surge current performance by the diode 125, improved RF performance and grounding at higher RF power levels (e.g., greater than 750 Watts), and greater bandwidth capabilities. The surge protection circuit 100 may operate in a bi-directional manner.

The first connector or port 105 and the second connector or port 110 may include center connector pins 106 and 111 of a coaxial cable or line. The first port 105 and the second port 110 maintain the system RF impedance between the device and the connected termination (e.g., 50 ohm, 75 ohm, etc.). The first connector 105 and the second connector 110 may be selected from one of the following connectors: 7/16 connector, N-Type connector, BNC connector, TNC connector, SMA connector, and SMB connector. The first connector 105 and the second connector 110 may be press-fit connectors, flange-mount connectors, or any other type of connectors.

Figure 14:
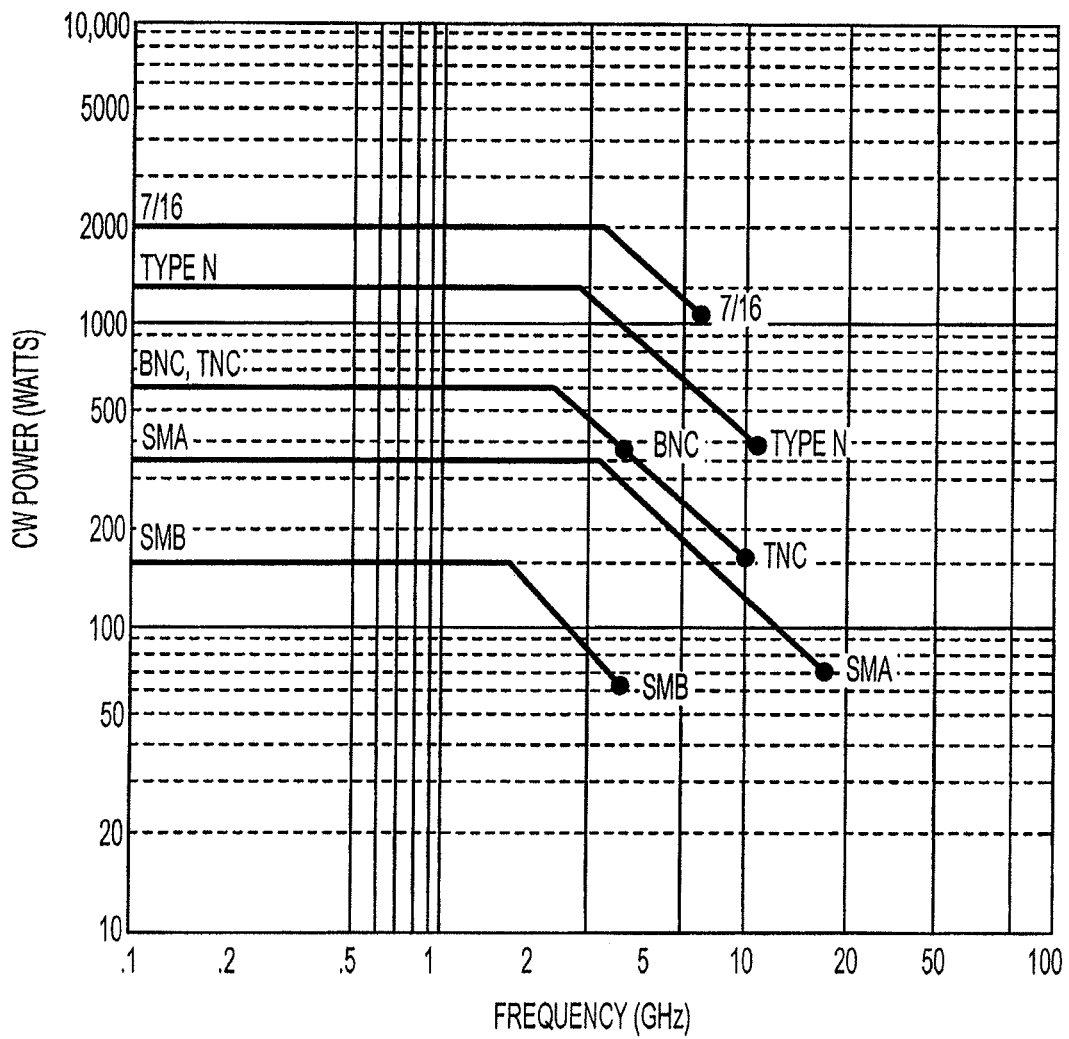
FIG. 14 shows a graph of the average RF power handling capabilities of a number of different connectors according to various embodiments of the invention.

FIG. 14 shows a graph of the average RF power handling capabilities of a number of different connectors. The combined RF plus DC power handling capabilities of the surge protection device 100 are generally limited by the type of connectors used. In one embodiment, the first connector 105 may be a N-type connector and the second connector 110 may be a SMA connector. In this example, the RF power handling capabilities may be limited to approximately 350 Watts (i.e., the power handling capabilities of the SMA connector).

Referring back to FIG. 1, the loop foil 115 allows DC currents and RF signals to pass from the first port 105 to the second port 110 and vice versa. The loop foil 115 is a curved copper foil material formed in the shape of a "U" or backwards "U". The loop foil 115 is a single integral piece of copper material but for illustrative purposes, the loop foil 115 will be referred to as having a first plate 115a, a second plate 115b, and a third curved plate 115c. The copper material of the loop foil 115 is about 0.016 inches in thickness. In one embodiment, the first plate 115a is positioned about 0.2 inches apart from the second plate 115b. The first plate 115a is positioned substantially parallel to the second plate 115b. The third curved plate 115c connects the first plate 115a to the second plate 115b.

The inductance, the mutual impedance, and the positioning of the loop foil 115 within the cavity 310 is used for impedance matching to compensate for internal RF mis-match impedances of the coil 120, the diode 125, and the cavity 310. The capacitance of the device can be increased by positioning the loop foil 115 closer to the walls of the cavity 310. The inductance of the device can be increased by using a thinner material for the loop foil 115. The mutual impedance of the device can be increased by moving the first plate 115a and the second plate 115b closer together. By increasing the inductance and the mutual impedance of the loop foil 115, the size and number of turns required in the coil 120 can be reduced resulting in further simplification of design and cost.

The coil 120 may be an inductor having one or more loops. The coil 120 has a first end 120a directly attached to the center connector pin 106 and a second end 120b directly attached to the diode 125. The coil 120 may have a 14AWG, 16AWG, 18AWG, or larger AWG. In one embodiment, the coil 120 has an inductance of about 0.5 uH. The coil 120 isolates the diode 125 from the RF transmission path. Also, the coil 120 adds isolation between the center connector pins and the diode 125 to achieve better passive intermodulation (PIM) performance compared to that of the diode 125 without isolation. When a surge event occurs (or a high DC surge voltage), the coil 120 effectively becomes a short circuit and the diode 125 operates to pass the surge event.

The diode 125 is connected to the coil 120 and the ground 130. That is, a first end of the diode 125 is connected to the coil 120 and a second end of the diode 125 is connected to the ground 130. The diode 125 can be oriented for a positive polarity or negative polarity DC clamping. In addition, the diodes 125 can be stacked to obtain higher voltage clamping while maintaining the equivalent current carrying capabilities.

The capacitor 135 is positioned in parallel with the diode 125. In one embodiment, the capacitor 135 has a capacitance of about 1,000 pF or higher. The capacitor 135 allows the energy to be shunted to ground 130 and prevents the diode 125 from prematurely being turned on. The size of the capacitor 135 is dependent on the frequency of operation and generally allows for broadband applications. The capacitor 135 provides better RF grounding for the surge protection circuit 100 at higher power levels. The surge path generally includes the coil 120, the diode 125, and the capacitor 135.

Figure 2D:
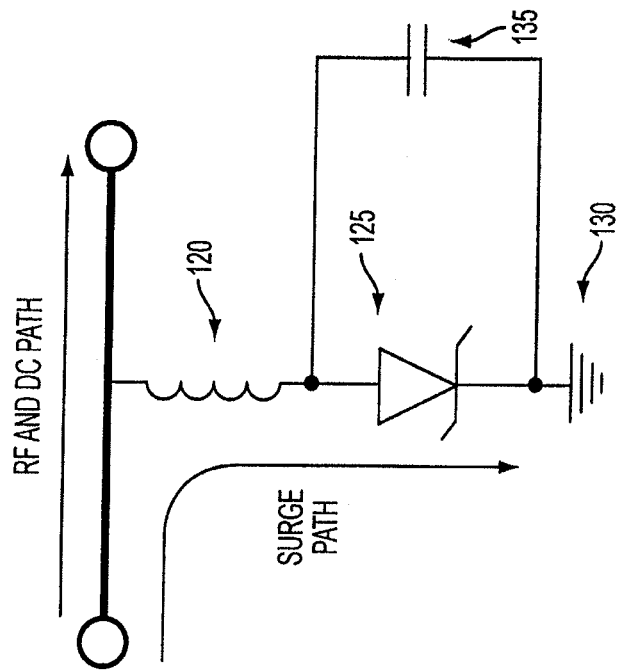
Figure 2C:
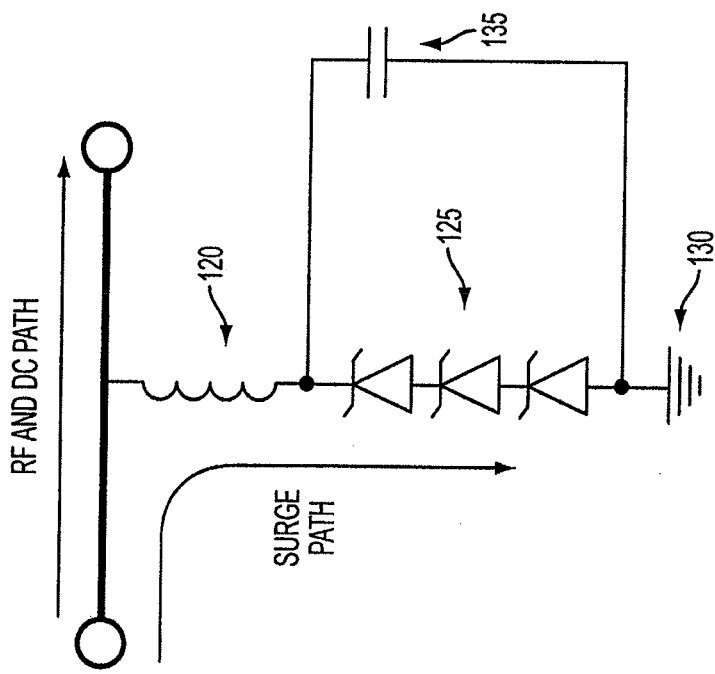

FIGS. 2A-2D are schematic diagrams showing different diode and capacitor configurations that can be implemented with the surge protection circuit of FIG. 1 according to various embodiments of the invention. The capacitor 135 may or may not be implemented in the surge protection circuit 100. The diodes 125 have superior voltage clamping characteristics. FIG. 2A shows a uni-directional diode, FIG. 2B shows a bi-directional diode, FIG. 2C shows multiple uni-directional diodes stacked in a series configuration, and FIG. 2D shows a uni-directional diode.

In one embodiment, the diode 125 can be a low voltage, bi-directional diode that is capable of handling 10 kA 8×20 micro-second surge currents with excellent voltage let-thru characteristics. In one embodiment, the diode 125 can be a bi-directional, high current transient voltage suppressor (TVS) diode having a breakdown voltage of between about 5.0-150.0 volts (e.g., 6, 12, 18 or 24 volts) and a high peak pulse power rating (e.g., 5,000, 20,000 or 30,000 watts). By isolating the diode 125 from the RF transmission path using the coil 120, the negative RF affects (e.g., capacitance) of the diode 125 are mitigated. The high frequency (RF) isolation characteristics of the coil 120 increases the impedance looking into the coil 120 and the diode 125 but the low frequency (DC and surge) components have a low impedance path to the diode 125.

Figure 3:
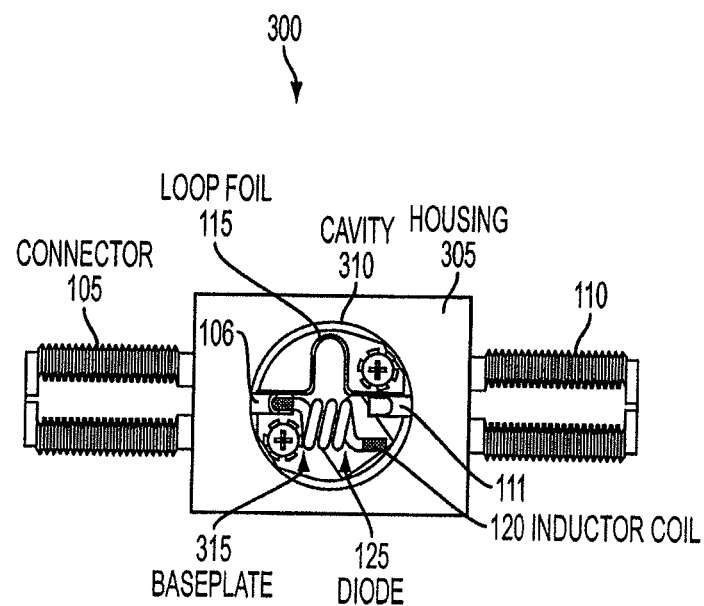
FIG. 3 is a top view of a surge protection device having the surge protection circuit of FIG. 1 according to an embodiment of the invention.
Figure 4:
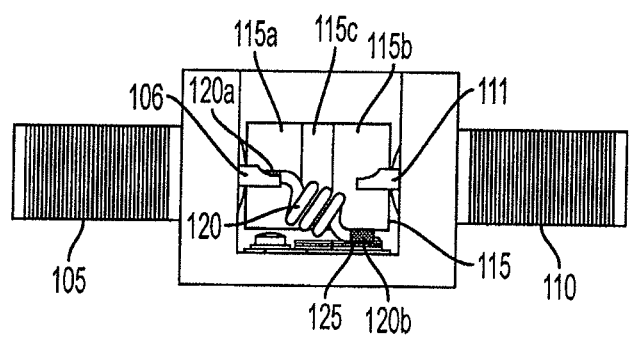
FIG. 4 is a side view of the surge protection device of FIG. 3 according to an embodiment of the invention.

FIGS. 3 and 4 are top and side views of a surge protection device 300 having the surge protection circuit of FIG. 1 according to an embodiment of the invention. Referring to FIGS. 3 and 4, the surge protection device 300 has a housing 305 and a cavity 310 defined by the housing 305. The cavity 310 may be formed in the shape of a circle (as shown), oval, ellipse, square, and rectangle. The loop foil 115 is positioned within the cavity 310. The loop foil 115 does not come into direct contact with the housing 305 but rather is connected between the center connector pins 106 and 111. The coil 120 is also positioned within the cavity 310 and is connected to the center connector pin 106 and the diode 125. In one embodiment, the diode 125 is connected to a base plate 315 or a base of the cavity 310.

The surge protection device 300 has various frequency characteristic bands within the range of approximately 300 Hz to 5 GHz. Return losses of greater than or equal to 20 dB and insertion losses of less than or equal to 0.1 dB, for example, are from approximately 700 MHz to 2,400 MHz. A return loss of greater than 50 dB may be realized within a narrow band, for example, between approximately 1,400 MHz and 1,600 MHz.

Figure 7:
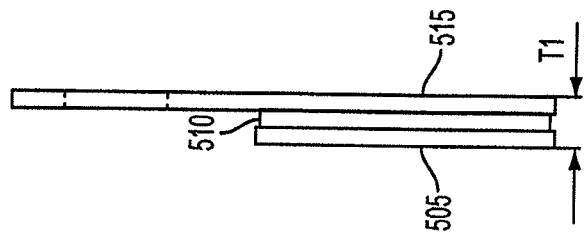
FIG. 7 is a side view of a diode of the surge protection device of FIG. 4 according to an embodiment of the invention.
Figure 6:
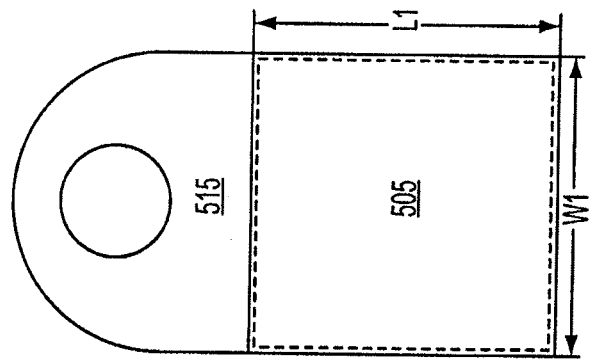
FIG. 6 is a top view of a diode of the surge protection device of FIG. 4 according to an embodiment of the invention.
Figure 5:
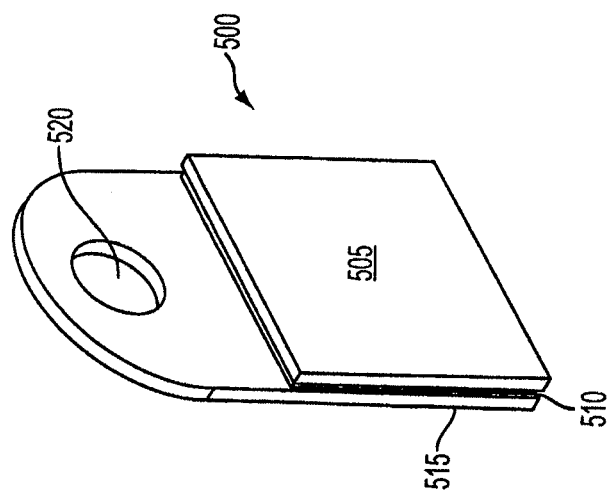
FIG. 5 is a perspective view of a diode of the surge protection device of FIG. 4 according to an embodiment of the invention.

FIGS. 5, 6 and 7 are perspective, top and side views of a diode of the surge protection device of FIG. 4 according to an embodiment of the invention. In one embodiment, the diode 125 may be a diode cell 500 having three layers 505, 510, and 515. The center diode junction or layer 510 may be sandwiched between top and bottom metal layers 505 and 515. The diode cell 500 does not have any wire leads, thus reducing the inductance and improving voltage clamping under high surge conditions. The second end 120b of the coil 120 is directly attached to the top metal layer 505 of the diode cell 500. The bottom metal layer 515 of the diode cell 500 is directly attached to the ground 130. No wire leads are used to connect the diode cell 500 to the coil 120 or the ground 130.

In one embodiment, the diode cell 500 may have a length L1 of about 9.40 mm, a width W1 of about 9.40 mm, and a thickness T1 of about 1.29 mm. The diode 125 may be two or more diodes in parallel circuit configuration. The diode cell 500 may include a hole 520 for mounting to the housing 305. If the hole 520 is not present, the diode cell 500 may be mounted or soldered to the base plate 315 to facilitate grounding of the diode 125 to the housing 305.

FIGS. 8, 9 and 10 are side, top and front views of a loop foil 115 according to an embodiment of the invention. In this embodiment, H2 is about 15.875 mm, L2 is about 22.36 mm, W2 is about 8.89 mm, and T2 is about 0.41 mm. The loop foil 115 is symmetrical when the end connectors are the same. That is, L3 and L4 have the same length of about 11.18 mm.

Figures 11, 12:
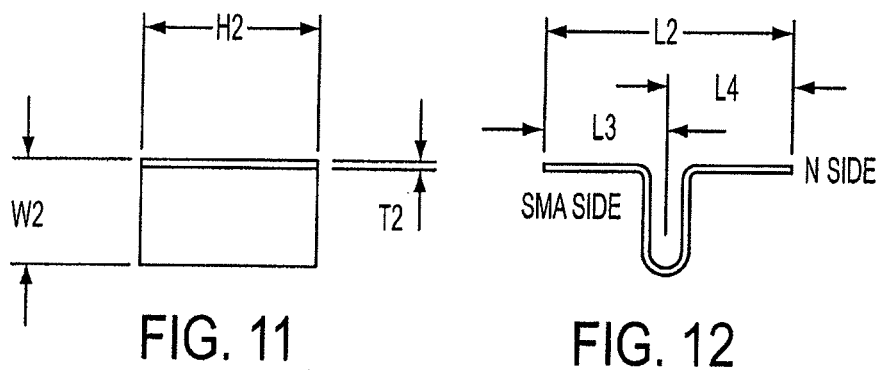
FIG. 11 is a side view of a loop foil according to another embodiment of the invention.
FIG. 12 is a top view of a loop foil according to another embodiment of the invention.
Figure 13:
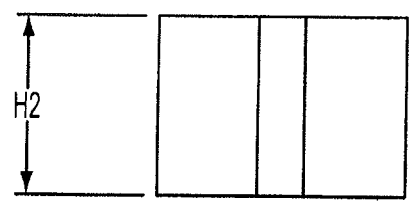
FIG. 13 is a front view of a loop foil according to another embodiment of the invention.

FIGS. 11, 12 and 13 are side, top and front views of a loop foil 115 according to another embodiment of the invention. In this embodiment, H2 is about 15.875 mm, L2 is about 22.36 mm, W2 is about 8.89 mm, and T2 is about 0.41 mm. Since one connector is a SMA connector and one connector is a N-Type connector, L3 and L4 have different lengths. That is, L3 is about 11.53 mm and L4 is about 10.06 mm. Each series of connectors (N or SMA, etc.) are manufactured for a fixed impedance (e.g., 50 Ohms) generally to the formula for coaxial lines which is a relationship including pin diameter, connector shell inside diameter and the supporting medium dielectric coefficient. The physical size of the two connectors is obviously different while maintaining the same impedance. Because of this physical difference, L3 and L4 must vary to impedance match to the cavity. There is actually some difference when using connectors of the same series but different gender, because actual center pin length varies. The variance is less dramatic than that of non similar series connectors in which case L3 and L4 generally are the same.

The previous description of the disclosed examples is provided to enable any person of ordinary skill in the art to make or use the disclosed methods and apparatus. Various modifications to these examples will be readily apparent to those skilled in the art, and the principles defined herein may be applied to other examples without departing from the spirit or scope of the disclosed method and apparatus. The described embodiments are to be considered in all respects only as illustrative and not restrictive and the scope of the invention is, therefore, indicated by the appended claims rather than by the foregoing description. All changes which come within the meaning and range of equivalency of the claims are to be embraced within their scope.

What is claimed is:

1. A surge protection circuit to reduce capacitance inherent of standard diode packaging and to improve voltage clamping reaction speeds under high surge conditions, the surge protection circuit comprising:
   a housing;
   a cavity defined by the housing;
   a signal path for propagating DC currents and RF signals, the signal path including:
      a first port for receiving the DC currents and the RF signals;
      a foil positioned within the cavity and having a first plate connected to the first port, a second plate and a third plate connecting the first plate to the second plate; and
      a second port for transmitting the DC currents and the RF signals, the second port being directly connected to the second plate of the foil,
      wherein the signal path is not directly connected to any capacitor or any diode, for minimizing attenuation of the DC currents and the RF signals; and
   a surge path including:
      the first port;
      a coil positioned within the cavity, the coil having a first end connected to the first port, and a second end; and
      a diode cell having a top layer, a center diode junction, and a bottom layer, the top layer directly connected to the second end of the coil and the bottom layer directly connected to a ground, wherein the diode cell has no wire leads.

2. The surge protection circuit of claim 1 wherein the first port is an N-type connector and the second port is a SMA-type connector and wherein the first plate has a smaller length than the second plate.

3. The surge protection circuit of claim 1 wherein the first plate is positioned substantially parallel to the second plate, and the third plate has a substantially curved shape, and the first plate, the second plate and the third plate form an integral member, the integral member having a substantially flat surface, a length, a width and a thickness, each of the length and the width of the integral member being substantially greater than the thickness of the integral member.

4. The surge protection circuit of claim 3 wherein the foil is made of a copper material that is formed in the shape of a U or a backwards U.

5. The surge protection circuit of claim 1 further comprising a capacitor connected in parallel configuration with the diode cell.

6. The surge protection circuit of claim 1 wherein the diode cell includes a plurality of diodes stacked in a series configuration.

7. The surge protection circuit of claim 1 wherein the diode cell is a bi-directional, high current transient voltage suppressor diode having a breakdown voltage of between about 5 volts and about 150 volts and a peak pulse power rating of up to 30,000 watts.

8. The surge protection circuit of claim 1 wherein the first plate of the foil is positioned substantially parallel to the second plate of the foil and the foil is configured to pass the DC currents and the RF signals.

9. The surge protection circuit of claim 1 wherein the foil is made of a copper material that is formed in the shape of a U or a backwards U.

10. The surge protection circuit of claim 1 wherein the first plate, the second plate and the third plate of the foil are formed as a single integral member.

11. A surge protection device comprising:
  a housing;
  a cavity defined by the housing;
  a signal path for propagating DC currents and RF signals, the signal path including:
    a first port positioned within the cavity for receiving the DC currents and the RF signals;
    a foil positioned within the cavity, the foil having:
      a first plate connected to the first port using a first conductive connection having a first length,
      a second plate positioned at a first distance from the first plate, and
      a third plate connecting the first plate to the second plate, the third plate being spaced apart from the housing, thereby creating a capacitive effect between the foil and the housing;
    a second port for transmitting the DC currents and the RF signals, the second port being directly connected to the second plate of the foil using a second conductive connection having a second length;
  a surge path including:
    the first port;
    a coil positioned within the cavity, the coil having a first end connected to the first port, and a second end; and
    a diode cell having a top layer, a center diode junction, and a bottom layer, the top layer directly connected to the second end of the coil and the bottom layer directly connected to a ground,
  wherein the signal path is not directly connected to any capacitor or any diode, for reducing attenuation of the DC currents and the RF signal.

12. The surge protection device of claim 11 wherein the foil is made of a copper material that is formed in the shape of a U or a backwards U, and the first plate, the second plate and the third plate form an integral member, the integral member having a substantially flat surface, a length, a width and a thickness, each of the length and the width of the integral member being substantially greater than the thickness of the integral member.

13. The surge protection device of claim 11 further comprising a capacitor connected in parallel configuration with the diode cell.

14. The surge protection device of claim 11 wherein the diode cell includes a plurality of diodes stacked in a series configuration.

15. The surge protection device of claim 11 wherein the diode cell is a bi-directional, high current transient voltage suppressor diode having a breakdown voltage of between about 5 volts and about 150 volts and a peak pulse power rating of up to 30,000 watts.

16. A surge protection device comprising:
  a housing;
  a cavity defined by the housing;
  a diode positioned within the cavity;
  a signal path for propagating DC currents and RF signals, the signal path including a first port for receiving the DC currents and the RF signals and a second port for transmitting the DC currents and the RF signals, wherein the signal path is not directly connected to any capacitor or any diode, for reducing attenuation of the DC currents and the RF signals;
  a foil positioned within the cavity, the foil having a first plate connected to the first port, a second plate connected to the second port, and a third curved plate connecting the first plate to the second plate, the foil being spaced apart from the housing, thereby creating a capacitive effect between the foil and the housing; and
  an inductor positioned within the cavity, the inductor having a first end connected to the first port and a second end connected to the diode.

17. The surge protection device of claim 16 wherein the foil is made of a copper material that is formed in the shape of a U or a backwards U.

18. The surge protection device of claim 16 further comprising a capacitor connected in parallel configuration with the diode.

19. The surge protection device of claim 16 wherein the diode includes a plurality of diodes stacked in a series configuration.

20. The surge protection device of claim 16 wherein the diode is a diode cell having a top layer, a center diode junction, and a bottom layer, the top layer directly connected to the second end of the inductor and the bottom layer directly connected to the housing.

* * * * *